United States Patent
Wong (10) Patent No.: US 7,586,806 B2
(45) Date of Patent: Sep. 8, 2009

(54) SRAM ACTIVE WRITE ASSIST METHOD FOR IMPROVED OPERATIONAL MARGINS

(75) Inventor: Robert C. Wong, Poughkeepsie, NY (US)

(73) Assignee: International Business Machines Corporation, Armonk, NY (US)

(*) Notice: Subject to any disclaimer, the term of this patent is extended or adjusted under 35 U.S.C. 154(b) by 186 days.

(21) Appl. No.: 11/845,395

(22) Filed: Aug. 27, 2007

(65) Prior Publication Data

US 2009/0059706 A1   Mar. 5, 2009

(51) Int. Cl.
G11C 7/00 (2006.01)
(52) U.S. Cl. .................... 365/226; 365/189.16
(58) Field of Classification Search .............. 365/226, 365/189.16, 154
See application file for complete search history.

(56) References Cited

U.S. PATENT DOCUMENTS

| | | | |
|---|---|---|---|
| 5,715,191 A | 2/1998 | Yamauchi et al. | |
| 5,757,702 A | 5/1998 | Iwata et al. | |
| 6,205,049 B1 | 3/2001 | Lien et al. | |
| 6,549,453 B2 | 4/2003 | Wong | |
| 6,654,277 B1 | 11/2003 | Hsu et al. | |
| 6,795,332 B2 | 9/2004 | Yamaoka et al. | |
| 6,891,745 B2 * | 5/2005 | Liaw | 365/154 |
| 6,925,025 B2 | 8/2005 | Deng et al. | |
| 6,990,035 B2 | 1/2006 | Redwine et al. | |
| 7,023,722 B2 | 4/2006 | Kanehara et al. | |
| 7,055,007 B2 | 5/2006 | Flautner et al. | |
| 7,502,275 B2 * | 3/2009 | Nii et al. | 365/226 |
| 2005/0068824 A1 | 3/2005 | Houmura et al. | |
| 2007/0121370 A1 | 5/2007 | Ellis et al. | |

OTHER PUBLICATIONS

K. Zhang et al., "A 3-GHz 70 Mb SRAM in 65 nm CMOS Technology with Integrated Column-Based Dynamic Power Supply," *2005 IEEE International Solid-State Circuits Conference*, IEEE, pp. 474-475, 611 (Feb. 9, 2005).

* cited by examiner

*Primary Examiner*—Son Dinh
(74) *Attorney, Agent, or Firm*—H. Daniel Schnurmann; Daryl K. Neff (57) ABSTRACT

A method is provided for controlling a voltage level supplied to a static random access memory ("SRAM"). In such method, when a column of the SRAM is selected for writing, a first p-type field effect transistor ("PFET") and a second PFET can be operated to supply the power at a lower voltage level to cells belonging to a selected column, the lower voltage level being lower than the power supply voltage level. The first PFET can have a conduction path connected between a power supply and the cells belonging to the selected column. The second PFET may have a conduction path connected between the cells belonging to the selected column and ground. While supplying the power at the lower voltage level, a cell belonging to the selected column may be written. When the column is no longer selected for writing, the first and second PFETs can be operated to supply the power at the power supply voltage level again to the cells belonging to the selected column.

20 Claims, 6 Drawing Sheets

SRAM ACTIVE WRITE ASSIST METHOD FOR IMPROVED OPERATIONAL MARGINS

CROSS-REFERENCE TO RELATED APPLICATION

This application is related to a concurrently filed U.S. patent application Ser. No. 11/845,386, entitled "SRAM HAVING ACTIVE WRITE ASSIST FOR IMPROVED OPERATIONAL MARGINS," which is assigned to the same assignee of the present application and whose content is incorporated herein by reference in its entirety.

BACKGROUND OF THE INVENTION

The present invention relates to static random access memories ("SRAMs"), and more particularly to SRAMs having circuits for altering a supply voltage level or low voltage reference thereto. In addition, aspects of the invention relate to methods of operating an SRAM in which a supply voltage level or low voltage reference thereto is altered during write operation.

SRAMs are uniquely suited to the functions they serve within processors and other devices for storage of data to which fast (low cycle time) and ready (low latency) access is desired. Certain types of storage within processors are almost always implemented using SRAMs, such as cache memories, control stores, buffer memories, instruction pipelines and data pipelines including input output interfaces and buffers for direct memory access ("DMA") interfaces. In addition, certain storage used for communication interfaces, e.g., network adapter buffers and so on, also utilize SRAMs for speed and low latency. Since SRAMs are frequently incorporated into chips on which other functions are implemented, e.g., processors (also referred to variously as microprocessors and central processing units ("CPUs")), they must perform at operating conditions as difficult as those that the processors must tolerate. In particular, SRAMs must perform within the same broad range of operating temperatures as processors and must be capable of tolerating fluctuations in supply voltages, e.g., noise disturbance, to the same extent as processors. Moreover, the sizes of SRAMs and SRAMs incorporated into chips having other functions are increasing. It is not uncommon for SRAMs to reach hundred million capacity or greater, even those which are incorporated into other chips such as processors. In addition, to satisfy a growing demand for application specific integrated circuits ("ASICs"), it is desirable to provide SRAM macros ("macros" being functional modules) with large capacities capable of incorporation into multi-function chips, despite the scaling of the transistors and voltages used therein to unprecedented small sizes and values.

Storage cells in an SRAM or "SRAM cells" are arranged in an array of SRAM cells or "SRAM array." Wordlines run in a direction of rows across an SRAM array. Bitlines run in a direction of columns across the SRAM array. Typically, one wordline is connected to each SRAM cell of a row of SRAM cells in the SRAM array. Typically, two bitlines carrying complementary signals are connected to each SRAM cell in a column of SRAM cells in the SRAM array, with one of the bitlines carrying a "true" signal representing the actual state of a bit signal and the other bitline carrying a "complementary" signal representing an inverted version of the bit signal.

As the size of each storage cell or "cell" within the SRAM array decreases with later generations of SRAMs, the threshold voltage of field effect transistors ("FETs") used in each SRAM cell is subject to increased variability. In addition, the voltage level at which power is supplied to the SRAM array is reduced or "scaled" with the introduction of new generations of SRAMs. Design constraints may also require the number of SRAM cells in each column or row to increase.

The increased variability of the threshold voltage of the FETs of SRAM cells and the reduced power supply voltage level make it harder to guarantee that certain margins of error are maintained during operation of the SRAM. Such margins of error have a direct bearing on the SRAM's ability to maintain the integrity of the data stored therein. Clearly, there is a requirement that an extremely small proportion of such errors occur during operation of an SRAM. The maximum tolerable error or upper limit for such error is often measured in terms of a number of "sigma", sigma representing the standard deviation in a distribution curve representing the occurrence of such errors. As currently manufactured SRAMs can have many millions of cells per SRAM array, the upper limit typically is set at one or two errors per the SRAM array. Stated another way, the maximum tolerable rate of error can be set at a level such as one or two failures per the entire SRAM, or one or two failures per 100 M, for example, where M denotes the number obtained by multiplying 1024 by itself or 1,048,576. This rate of error translates approximately to 5.2 sigma.

Margins of error which need to be maintained in the SRAM include access disturb margin ("ADM") and write margin ("WRM"). The state of a bit stored in an SRAM cell is more likely to undergo a spontaneous inversion when the SRAM cell is partially selected. ADM pertains to the likelihood that the state of a bit stored in a partially selected cell of the SRAM array will spontaneously change from one state to another, e.g., flip from a "high" to a "low" state when a cell of the SRAM is accessed during a read or write operation. The unselected SRAM cell is "half" selected when a wordline connected to the SRAM cell has been activated, e.g., when one SRAM cell connected to that wordline is accessed for either a read or a write operation. Those "half" selected cells are more susceptible to access disturbs since the cells are to be disturbed even when they are not being accessed.

Another margin of error that must be satisfied is the ability to write the state of bit to an SRAM cell, given the strength of the bitline signals supplied to the SRAM cell and the time allotted to do so. Here, it is important that the SRAM cell have sufficient drive current to change from one stable state to another state under the influence of the bitline signals supplied thereto. If the SRAM cell fails to be written with the bit that is provided thereto, data integrity is impacted. WRM pertains to the occurrence of this type of error. Here again, it is important to reduce this type of error to an extremely miniscule amount. WRM, like ADM is typically measured in terms of standard deviations or "sigma" from a center of a distribution of the occurrence of error. As in the above case, WRM should preferably be maintained at a high sigma number, preferably at a sigma value of about 5.2 or more.

The scaling of one or more voltages supplied to each SRAM cell of the SRAM array for each succeeding generation of SRAMs only increases the difficulty of achieving a desired ADM and desired WRM. Various approaches have been suggested for providing high ADM, despite the scaling of the voltages. Increasing the magnitude of the threshold voltage of each n-type FET ("NFET") and p-type FET or ("PFET"), i.e., raising the NFET threshold voltage and reducing the PFET threshold voltage helps improve ADM. Such practice improves ADM because each SRAM cell changes state only when a greater change occurs in voltages on the bitlines which is capable of exceeding a higher magnitude threshold voltage of one or more devices within the SRAM cell. However, such approach potentially worsens WRM. In an SRAM in which the available amount of drive current within each SRAM cell is already limited because of the scaling of the voltage, increasing the magnitude of the NFET and PFET threshold voltages makes the writing of each SRAM cell more difficult than before.

Moreover, whether or not the threshold voltage of the NFETs is raised or that of the PFETs is lowered, ADM and WRM tend to respond differently to temperature. The sigma value of ADM tends to be higher at lower temperatures, e.g., when a chip containing an SRAM is first turned on or when the chip is running at lower frequency. On the other hand, the sigma value of ADM becomes lower with increasing temperature. The sigma value of WRM may be lower at lower temperatures, and the sigma value of the WRM may become higher with increasing temperature. As transistor sizes are scaled further downward in future generations of SRAMs, it becomes more difficult to achieve desirable sigma values on both ADM and WRM over the range of temperatures in which SRAMs (and processors which incorporate them) are required to operate.

Providing a write scheme for an SRAM cells having PFET passgates is one goal featured in commonly assigned U.S. Pat. No. 6,549,453 to Wong. In one described scheme, a voltage provided to a memory cell is adjusted from one level to another during a data writing operation to the memory cell. Circuits are provided which allow a power supply voltage to pull-up devices of the memory cell to "float down" to a lower level during the data writing operation. In addition, in one or more other schemes described therein, pull-down devices of the memory cell are disconnected from ground and allowed to "float up" to a voltage level higher than ground.

Commonly assigned U.S. Patent Publication No. 2007/0121370 to Ellis et al. also describes methods in which a voltage provided to a memory cell is adjusted from one level to another when writing data to a memory cell. In the face of further scaling of the transistors and voltages used in SRAM cells, new ways are needed to maintain high WRM and ADM in SRAMs.

As the number of SRAM cells per column increases, it is becoming increasingly difficult to alter a voltage at which is supplied to a column of cells in a given amount of time.

SUMMARY OF THE INVENTION

In the face of further scaling of transistors therein, new circuits and methods are needed to maintain high write margin and access disturb margin in static random access memories ("SRAMs").

In accordance with embodiments of the invention herein, methods are provided in which a voltage is altered at which power is supplied to cells belonging to a selected column of an SRAM. Alternatively, methods are provided in which a voltage level is raised of a low voltage reference for cells belonging to a selected portion of the SRAM.

In accordance with an aspect of the invention, a method is provided for controlling a voltage level supplied to a static random access memory ("SRAM"). In such method, power can be supplied to cells of the SRAM at a power supply voltage level. When a column of the SRAM is selected for writing, a first p-type field effect transistor ("PFET") and a second PFET can be operated to supply the power at a lower voltage level to cells belonging to the selected column, the lower voltage level being lower than the power supply voltage level. The first PFET can have a conduction path connected between a power supply and the cells belonging to the selected column. The second PFET may have a conduction path connected between the cells belonging to the selected column and ground. While supplying the power at the lower voltage level, a cell belonging to the selected column may be written. When the column is no longer selected for writing, the first and second PFETs can be operated to supply the power at the power supply voltage level again to the cells belonging to the selected column.

DETAILED DESCRIPTION

Figure 1:
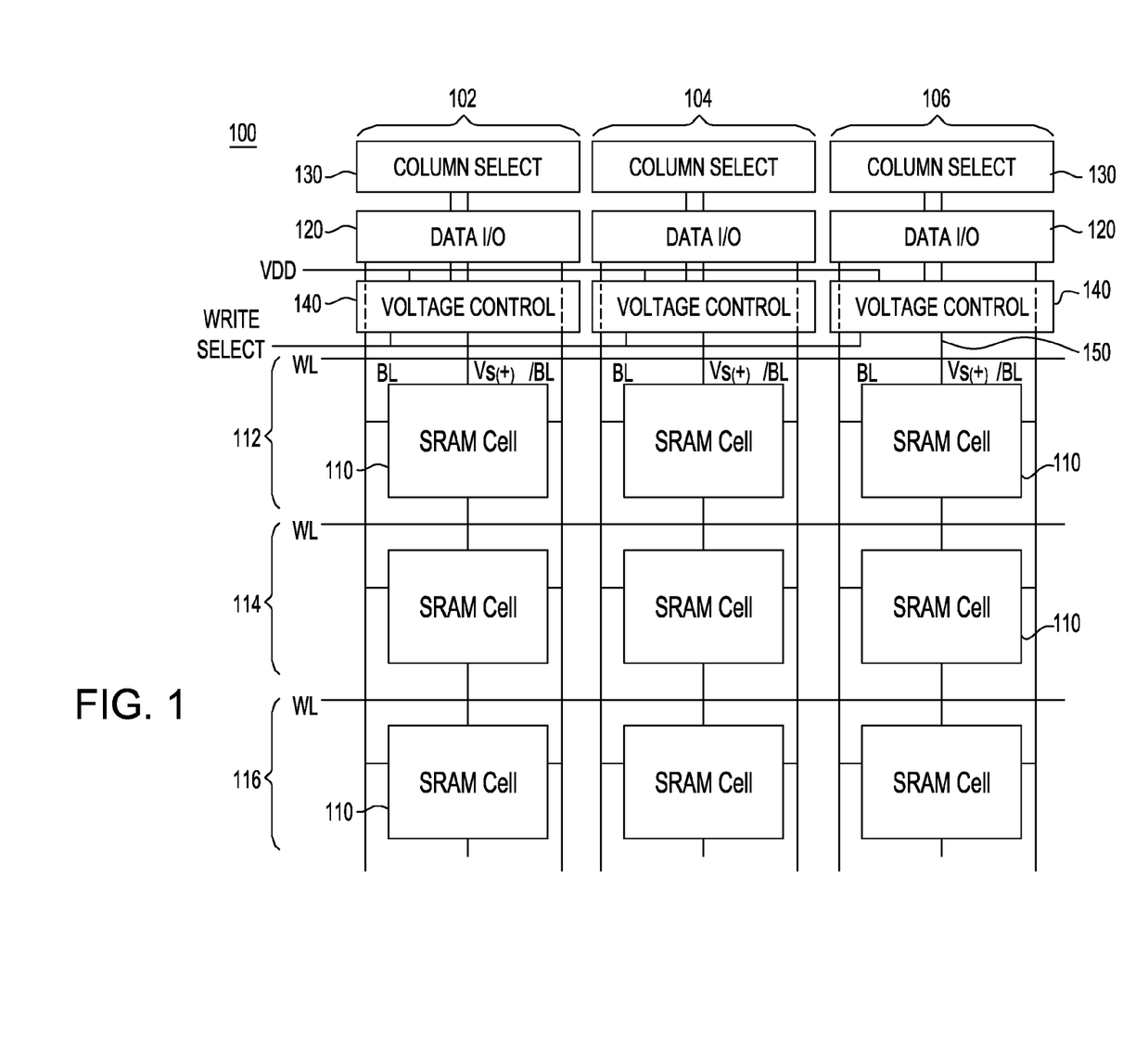
FIG. 1 is a block and schematic diagram illustrating an SRAM in accordance with an embodiment of the invention.

FIG. 1 is a block and schematic diagram illustrating an SRAM 100 in accordance with an embodiment of the invention. The SRAM 100 can be a stand-alone SRAM on a dedicated chip containing only one or more such SRAMs 100, or be incorporated into a chip having one or more additional functions, such as incorporated into a chip on which a processor or network interface is provided, for example.

As illustrated in FIG. 1, the SRAM includes a plurality of storage cells 110, each storage cell operable to store a data bit and to provide read access and write access thereto when power is supplied to the SRAM 100 during normal operation. The SRAM 100 typically includes many such cells, ranging from several thousand cells per SRAM to many millions of cells. Within the SRAM, storage cells are arranged in an array having a plurality of columns 102, 104, 106, etc., a plurality of rows 112, 114, 116, etc. For ease of illustration, only a few such cells 110 are shown.

The bitlines of the SRAM are arranged in a direction of the columns, two complementary bitlines BL and /BL being provided per each column of the array. One bitline (BL) is a "true" bitline which carries a signal representing the true or actual value of the data bit that is read from or written to one of the SRAM cells 110 coupled to that bitline. The other bitline (/BL) carries a signal representing the complement of the value of the data bit that is read from or written to one of the SRAM cells 110 coupled to that bitline. The wordlines WL of the SRAM are arranged in a direction of the rows, one wordline being provided for each row. The wordlines WL operate to provide read and write access to cells coupled to each wordline in a row of the SRAM.

Greatly simplified, the reading of data to the SRAM and writing of data from the SRAM is performed by changing the voltage of the wordline WL from an inactive level to an active level to provide access a row of cells within the SRAM, e.g., row 112. Then, when the operation is to read data stored in the SRAM, a data bit stored in one of the cells of the accessed row is transmitted as a signal along the complementary pair of bitlines BL, /BL coupled to the cell to the data input output ("I/O") unit 120 coupled to the pair of bitlines. When the operation is to write data to the SRAM, a data bit is transmitted as a signal from the data I/O unit 120 in a direction of an accessed column of cells along the complementary pair of bitlines BL, /BL to one of the cells that also belongs to the row of cells accessed by the wordline WL.

During a read operation, when the signal arrives at the data I/O unit 120, it usually is a small swing signal having a value, e.g., 50 to 300 millivolts (mV) which varies little from when the signal is inactive to when it is active. Illustratively, a sense amplifier in the data I/O unit 120 amplifies the small swing signal arriving thereto from the accessed cell to a rail-to-rail signal, i.e., one which has either a normal high logic level or a normal low logic level. In CMOS technologies of interest at the time of this application, a rail-to-rail signal can swing from a high logic level ranging from about 0.6-0.8 V (nominally 0.8 V) to a low logic level of ground. However, the embodiments of the invention herein are usable in SRAMs which have smaller signal swing than 0.6 V to ground or larger signal swing than 0.8 V to ground as discussed here. In addition, while the low logic level is frequently set at ground, SRAMs exist in which the low logic level is set at a voltage other than ground. Unless otherwise specified, it is intended by way of the examples and embodiments described herein not to limit the nominal high and low logic levels used within the SRAM to any particular voltages or ranges of voltage.

During a write operation, a particular column of the SRAM is selected to be written through column select circuitry 130, as driven by column addressing signals provided thereto (not shown). Prior to performing the write operation, the voltage levels on both bitlines BL and /BL are set to the high logic level. During the write operation, typically the voltage on one of the bitlines BL and /BL of a column is lowered from the high logic level to the low logic level. Typically, a data bit value of zero is represented by a voltage of ground and a data bit value of one is represented by the high logic level, being illustratively 0.8 volt. Thus, illustratively, when a data bit value of zero is to be written, the voltage on the true bitline BL is lowered to ground. Conversely, when a data bit value of one is to be written, the voltage on the complementary bitline /BL is lowered to ground. An operation to write the SRAM cell is thus a process driven by the ground voltage level on one of the pair of bitlines.

As further shown in FIG. 1, the SRAM includes a voltage control unit 140, which can be provided at a rate of one unit per column. The voltage control unit 140 raises and lowers the power supply voltage Vs(t) to each SRAM cell within a particular column as a function of time to permit a cell belonging such column to be written more easily. The voltage control unit 140 controls the level of the power supply voltage Vs(t) between a nominal level Vdd and a lowered level Vdda. The nominal level Vdd is a level at which power is normally provided to cells within the SRAM during read operations and to columns within the SRAM whenever those columns are not being written to at a particular time. The lowered level Vdda is a level at which power is provided to cells in a particular column of the SRAM when a cell belonging to such column is being written. Ordinarily, the lowered level Vdda will be greater than 50% of the Vdd level. As a boundary condition, the lowered level Vdda should be less than the threshold voltage level of the NFET transistor in a cell of the SRAM. The lowered level Vdda may, for example, be a level of about 80% of the nominal level Vdd. As an illustrative example, when Vdd is about 0.8 volt, the lowered level Vdda can be a level which is 150 mV lower, or about 0.65 volt. In an exemplary embodiment, Vdda is lower than Vdd by an amount smaller than the threshold voltage of a transistor used to vary the power supply voltage Vs(t) between the two levels.

When the voltage Vs(t) supplied to SRAM cells is at the nominal level Vdd, the SRAM is better protected against access disturbance, that is, against the above-described problem of a stored bit changing from "1" to a "0" or the other way. However, reducing the voltage Vs(t) supplied to the SRAM cells to the lowered level Vdda permits a cell of a selected column of SRAM cells to be written more easily. This increases one's ability to write to the SRAM and improves write margin within the SRAM.

As further shown in FIG. 1, preferably, each column of the SRAM cells is served by a separate conductor 150 carrying a power supply voltage in a layout pattern referred to as "thin cell layout." In such layout, power supply conductors run along the middle of columns of SRAM cells. The placement of the power supply conductors in the middle of columns of SRAM cells allows the power supply voltage to individual columns to be lowered while minimizing the effects upon cells in neighboring columns of the SRAM. In particular, the placement of power supply conductors in the middle of the columns reduces or minimizes the coupling of noise to the cells of neighboring columns due to changes in the levels of the voltage supplied to individual columns.

Figure 2:
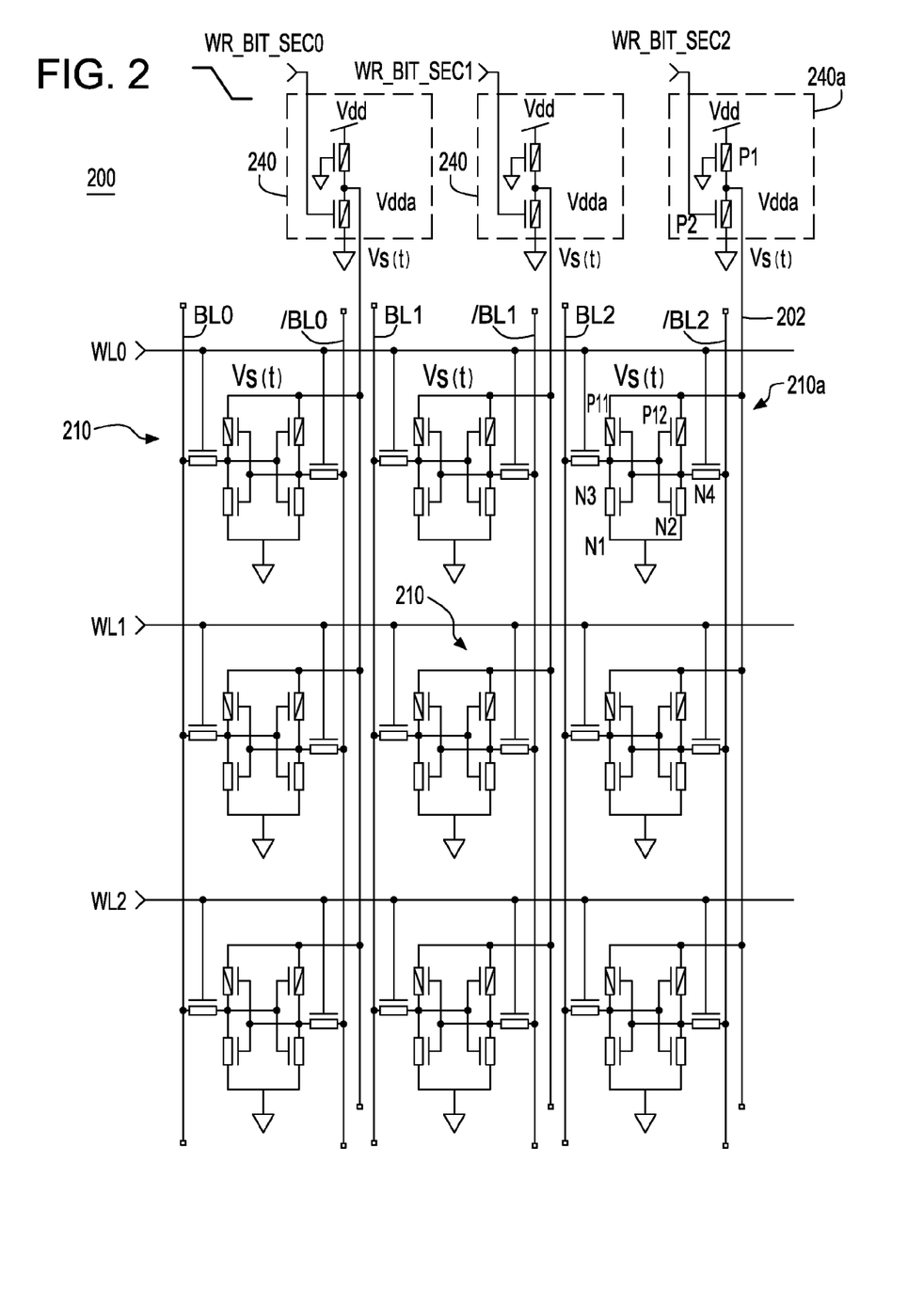
FIG. 2 is a schematic diagram further illustrating an SRAM in accordance with a particular embodiment of the invention.

FIG. 2 is a schematic diagram further illustrating an SRAM 200 according to a particular embodiment of the invention. The SRAM 200 is a particular example of the SRAM 100 described above with reference to FIG. 1 and operates in a manner like that of SRAM 100 described above. The structure and operation of SRAM 200 are described herein only to the extent as more particularly shown in FIG. 2 in relation to SRAM 100. As shown in FIG. 2, the SRAM 200 includes a plurality of individual storage cells 210. As above, only a few of the storage cells of the SRAM are shown in FIG. 2 for ease of illustration. Each storage cell, for example cell 210*a*, includes a latch and passgates. The latch includes a pair of cross-coupled inverters including a first inverter formed by PFET P11 and NFET N1, and a second inverter formed by PFET P12 and NFET N2. In each latch, the gate inputs of each inverter are connected to the common drain terminal of the other one of each inverter shown. In the particular example shown in FIG. 2, cell 210*a* and other cells 210 of the SRAM each include a pair of passgates implemented by NFETs N3 and N4.

Passgates N3 and N4 are activated by a high logic level voltage provided to the gate inputs of N3 and N4. When activated, the passgates N3 and N4 permit a bit to be read from or stored to a cell 210. Specifically, when activated, during a read operation the passgates couple bit signals from a cell 210 onto bitlines BL and /BL to be read by data I/O circuitry (FIG. 1). In addition, during a write operation, the passgates couple bit signals driven on bitlines BL and /BL by the data I/O circuitry to a cell 210 to write a data bit the cell 210.

The SRAM 200 further includes voltage control circuits 240, which can have a structure as shown particularly in FIG. 2. The voltage control circuit for each column of the SRAM 200 can include a first PFET P1 and a second PFET P2, as illustrated in voltage control circuit 240*a*. The drain of PFET P1 can be tied to the source of PFET P2 at a common node through which power is supplied to cells belonging to a column of the SRAM. As illustrated in FIG. 2, the first PFET can have a conduction path connected between the power supply (Vdd) and the cells belonging to the column. The second PFET can have a conduction path connected between the cells of the column and ground. In order to conduct current between the power supply Vdd and the cells of the column, PFET P1 can be kept turned on, its gate being tied to a low voltage level such as ground. A write bit select signal, e.g., signal WR_BIT_SEL2 is applied to the gate of PFET P2 to turn P2 on when the column connected thereto is selected for writing.

Operation of the voltage control circuit 240a is as follows. During a read operation or during operation in which the SRAM is neither read from nor written to, the write bit select signals WR_BIT_SEC0, WR_BIT_SEC1, and WR_BIT_SEC2 are maintained at the high logic level, such as Vdd. Under such condition, the signal WR_BIT_SEC2 applied to the gate of PFET P2 of the voltage control circuit 240a keeps P2 turned off. At that time, the full power supply voltage level Vdd is passed from the power supply Vdd to the drain of PFET P1. In such case, the full power supply voltage level Vdd is passed through to cells of the column 202 served by the voltage control circuit 240a.

On the other hand, during a write operation, the write bit select signal WR_BIT_SEL2 to the voltage control circuit 240a transitions to the low logic level. At that time, both PFET P1 and PFET P2 at least partially turn on. P2 functions as a pull-down device having an effect of reducing the voltage at its source from the Vdd level to a lower level. The use of P2 as a pull-down device assures that the voltage control circuit 240a and other like voltage control circuits 240 actively transition the power supply voltage when the voltage control circuit is selected by a write bit select signal. The pull-down device actively pulls down the power supply voltage Vs(t) present at the source of P2 from Vdd to the lower Vdda level. In fact, in general, the circuit 240a transitions the power supply voltage from the nominal level Vdd to the lower level Vdda faster than in a circuit which has no such pull-down device connected to transistors P1 and P2. By lowering the power supply voltage Vs(t) quickly from Vdd to the lower level upon arrival of the WR_BIT_SEL2 signal, the circuit 240 applies the lower level of the power supply voltage Vs(t) at an earlier point in time to the cells of column 202. The lowered power supply voltage level of Vs(t) and its early application to the cells of column 202 assure that a write operation to one of the cells along that column 202 is performed as early within the duty cycle of the write operation as possible.

Figure 3A:
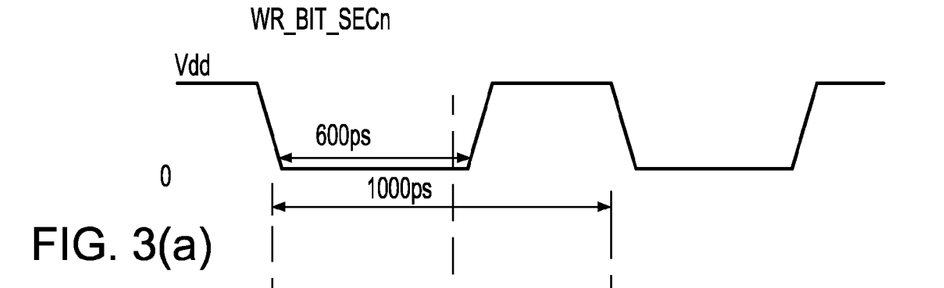
FIGS. 3(a) through 3(d) are timing diagrams illustrating operation of an SRAM in accordance with an embodiment of the invention.

FIGS. 3(a) through 3(d) are timing diagrams illustrating signals during a write operation to a cell 210a of an SRAM 200 according to the embodiment of the invention illustrated in FIG. 2. Signals are timed such that the power supply voltage Vs(t) is lowered to the accessed column prior to the activation of the wordline WL, thus assuring that conditions are at their most favorable for writing the cell beginning from the time that the wordline is activated. Some of the signals shown in FIGS. 3(a) through 3(d) transition at signal edges that coincide together, as described below. The time intervals shown in FIGS. 3(a) through 3(d) are illustrative of the duty cycles of the signals in relation to each other. In the illustrative example shown in FIGS. 3(a) through 3(d), the cycle time for performing one write access to the SRAM is 1000 picoseconds ("ps"), i.e., 1 nanosecond ("ns"), Operation of the SRAM in accordance will now be explained with reference to the signals shown in FIGS. 3(a) through 3(d). FIG. 3(a) illustrates a write bit select signal WR_BIT_SELn. This signal activates one of the voltage control circuits 240 shown in FIG. 2, for example, the voltage control circuit 240a to lower the power supply voltage Vs(t) to a selected column of the SRAM. This signal is also used to select and activate one bitline (i.e., lower the voltage thereon to ground) of the pair of complementary bitlines of the selected column.

Figure 3B:
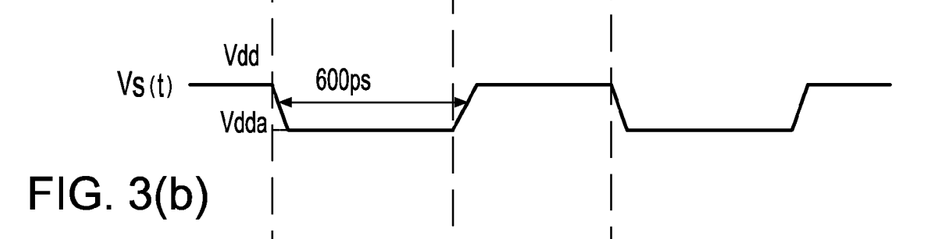

As seen in FIG. 3(b), the power supply voltage Vs(t) input to the column of SRAM cells falls from the higher steady-state level Vdd value to the lowered level Vdda in synchronism with the rise in the signal WR_BIT_SELn input to the voltage control circuit 240. At such time, PFET P2 of the voltage control circuit 240a (FIG. 2) actively pulls down the power supply voltage from Vdd to the lowered level Vdda. The lowered level Vdda is determined by the threshold voltage of PFET P2 in that PFET P2 conducts only when Vsg−Vsd>|$V_T$| ($V_T$ being the threshold voltage of P2). Since Vg=Vd=ground when WR_BIT_SECn is active, P2 is turned on when the voltage Vdda is greater than its threshold voltage $V_T$ but is not turned on when the voltage Vdda is less than or equal to $V_T$. Thus, the operation of PFET P2 is self-limiting, in that it cannot possibly pull down Vs(t) any lower than its own threshold voltage. However, by appropriately selecting the design of transistor P2, Vs(t) may not fall entirely to a lower voltage level of $V_T$, but rather to a lower voltage level which is above $V_T$. As the voltage Vdda falls at the source of PFET P2, P2 becomes more resistive. The greater resistance of P2 results in a voltage drop across P2. Due to the voltage drop, the value of Vs(t) supplied to the selected column can be quite a bit higher than the threshold voltage of P2.

In such manner, the power supply voltage Vs(t) readies the cell for writing when WR_BIT_SECn transitions from the high Vdd level to ground. In addition, referring to FIG. 3(c), in preparation for writing the data bit to the cell, the voltage level on one bitline of the pair of bitlines BL, /BL is also lowered from Vdd to ground at or about the same time that WR_BIT_SECn falls from Vdd to ground.

After the foregoing transitions have occurred: i.e., WR_BIT_SECn having transitioned to the active state, e.g., from Vdd to ground, the bitline signals adjusted to a value for writing a data bit to the cell, and the power supply voltage Vs(t) having been lowered to the lowered level Vdda, the wordline is activated. Conventionally, it is sought to increase the duty cycle of a wordline to be as long as possible within the cycle time for writing a data bit to a cell of the SRAM. This is done to allow time for signal current to flow between the cell through passgates of the cell to or from the bitlines, causing the latch of the cell to flip from one state to the other.

However, the state of a data bit stored in one cell of the SRAM cannot change until other conditions favor its immediate change. Here, conditions are not at their most favorable for changing the state of a bit stored in the SRAM until the power supply voltage level Vs(t) has fallen to the lowered level Vdda from the nominal level. In recognition thereof, in the embodiment of the invention illustrated in FIGS. 2 and 3(a) through 3(d), the duty cycle of the WR_BIT_SELn, the lowered voltage level Vdda, and the bitline write values are made to be at about 50% or more of each write cycle. Then, the wordline is activated at the earliest time at which the foregoing signals can be considered to reach stable states following their transitions. In the particular example shown in FIGS. 3(a) through 3(d), the wordline is activated at a time of approximately 50 to 100 ps later, i.e., at a point in time which is approximately 5 to 10% of the cycle time later than the time at which the power supply voltage level Vs(t) and the bitlines begin to transition to their write values. In such manner, the wordline is activated at a time when it is most favorable to write a new data bit value to the accessed cell.

After the wordline is activated, it remains active for a period of time such as 500 ps, such duty cycle preferably being the maximum duty cycle permitted within the period of a one nanosecond writing cycle of the SRAM. In addition, such duty cycle is selected to assure that the power supply voltage Vs(t) has reached the lowered level Vdd and the signals on the bitlines are stable or at least near stable state. After the wordline is activated, current flows through the passgates of the cell between the cell and the bitlines coupled to the cell. Depending upon the value of the bit that was last previously stored in the cell and the value of the data bit being written, the state of the SRAM either stays the same or flips from the one state to the other state, i.e., from zero to one, or from one to zero.

Figure 3C:
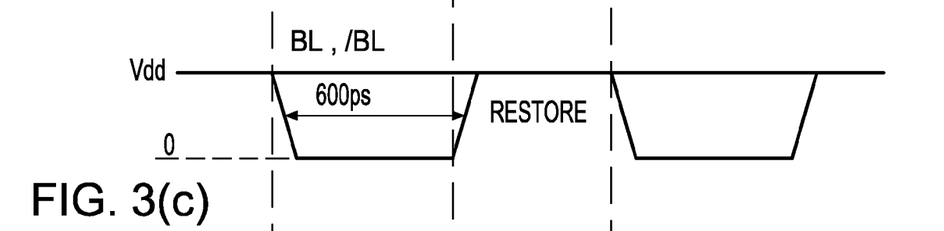
Figure 3D:
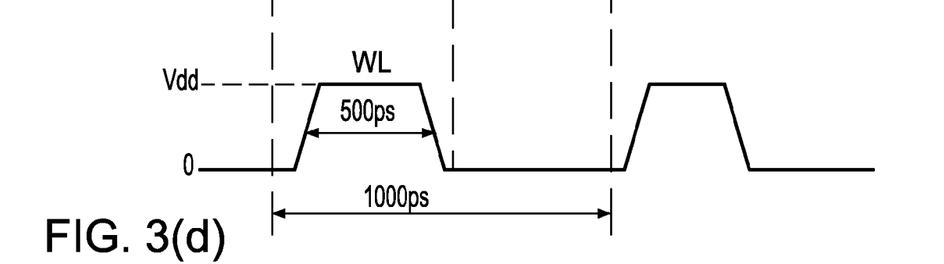

Thereafter, the after the bit has been written to the cell, the wordline is deactivated again. The write bit select signal WR_BIT_SELn returns to Vdd and the bitline signals are both restored to Vdd. The power supply voltage Vs(t) also returns to Vdd. Referring to FIG. 3(c), a precharge/restore interval ("RESTORE") then occurs.

Following the precharge/restore interval, when a cell is selected to be written again, a write bit select signal WR_BIT_SELn for the selected column is activated again, at which time the operations of lowering the power supply voltage Vs(t), lowering the voltage on one of the bitlines to a column occur, after which a wordline for a selected row is activated to write the data bit to the selected cell.

In a variation of the embodiment described with reference to FIGS. 3(a) through 3(d), logic circuitry may be employed to enhance the reliability of writing to cells of the SRAM when the SRAM is to be written continuously with data for a period of time extending over a plurality of cycles. As an example thereof, when data is to be written to a defined subset of the columns of the SRAM, the signal WR_BIT_SECn is lowered from Vdd to ground and the power supply voltage Vs(t) are each lowered for that subset of columns, such that each of the columns then becomes primed to be written. These signals are then left steady, unchanging at these active states for the whole time and for the number of cycles in which writing is performed continuously to the SRAM. Signals on bitlines are then altered in each cycle to write values, but only for the columns of the SRAM being written in each cycle. Corresponding wordlines of the SRAM are also activated in each cycle for the cells to be written in each cycle. Here, by leaving the write bit select signals and power supply voltage waveform Vs(t) steady to each of many columns being written over a series of cycles, the power supply voltage has a greater measure of stability at the lowered level to such columns. In such manner, it may be possible to reduce the amount of switching of the power supply waveform Vs(t) provided to a column of the SRAM when writing to the same column continuously in two or more consecutive cycles.

Figure 4:
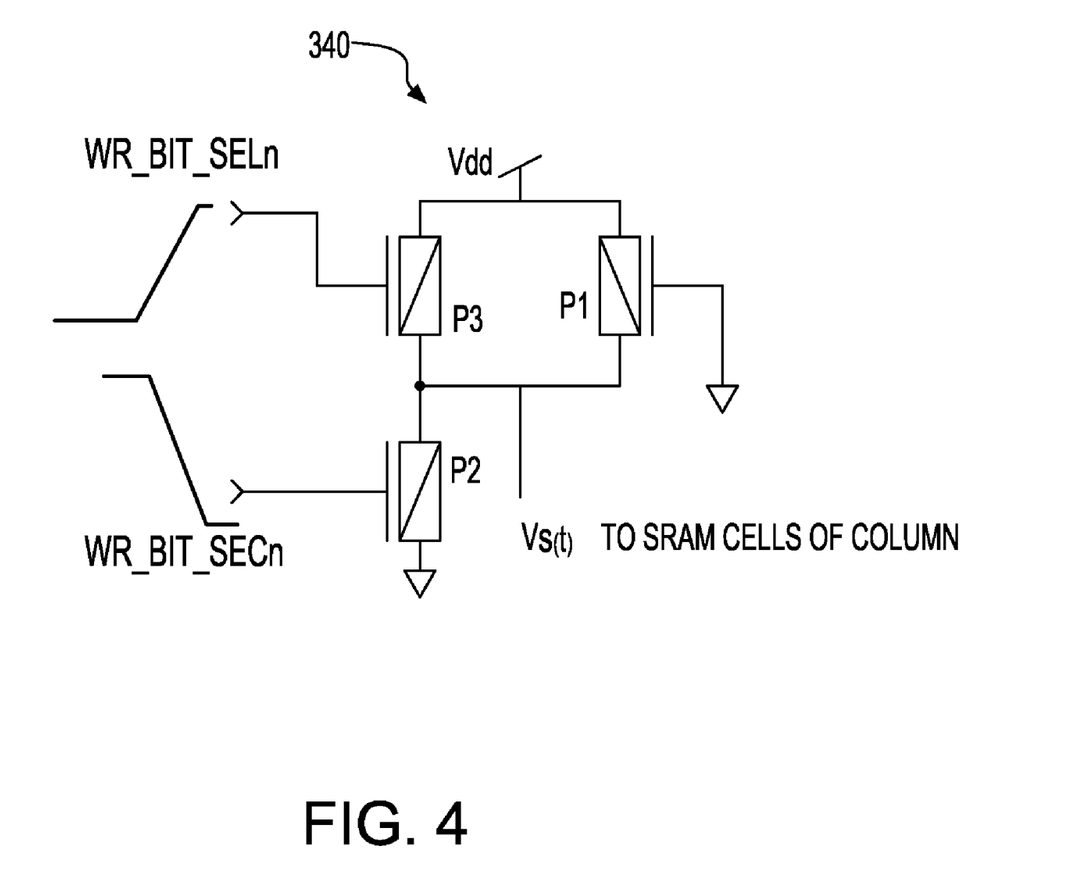
FIG. 4 is a schematic diagram illustrating an alternative voltage control circuit in accordance with a variation of the embodiment illustrated in FIG. 2.

FIG. 4 illustrates a variation of the embodiment described above with reference to FIG. 2. As shown in FIG. 4, the voltage control circuit 340 includes the first and second PFETs P1 and P2 as shown and described above with respect to FIG. 2. The voltage control circuit additionally includes a third PFET P3 which is connected in parallel with P1. PFET P3 is normally kept turned on by an inactive (low) signal level of WR_BIT_SELn applied to its gate. P3 may be designed to conduct significantly more current than P1. As a result, when the column is not selected, the voltage Vdd is passed through P1 and P3 to the node Vs(t) such that power is maintained to the column at Vdd.

However, when the column is selected for writing, the WR_BIT_SELn signal transitions to a high logic level such as Vdd, causing PFET P3 to present much greater resistance or turn off. As the WR_BIT_SELn goes higher, the ability of PFET P2 to actively pull down the voltage Vs(t) increases. The embodiment illustrated in FIG. 4 can be especially useful when many cells, e.g., 128 to 256 cells, belong to the same column. In such case, many cells load the voltage control circuit 340 such that a relatively large amount of current is needed to pull the voltage up to Vdd, such as when reading the cells. However, PFET P1 can be a smaller device, causing it to be relatively resistive. PFET P3 provides a parallel conduction path which compensates for the greater resistance of P1. PFET P3 remains turned on to pull the voltage of cells of the column up to Vdd when the column is not selected for write operation.

Figure 5:
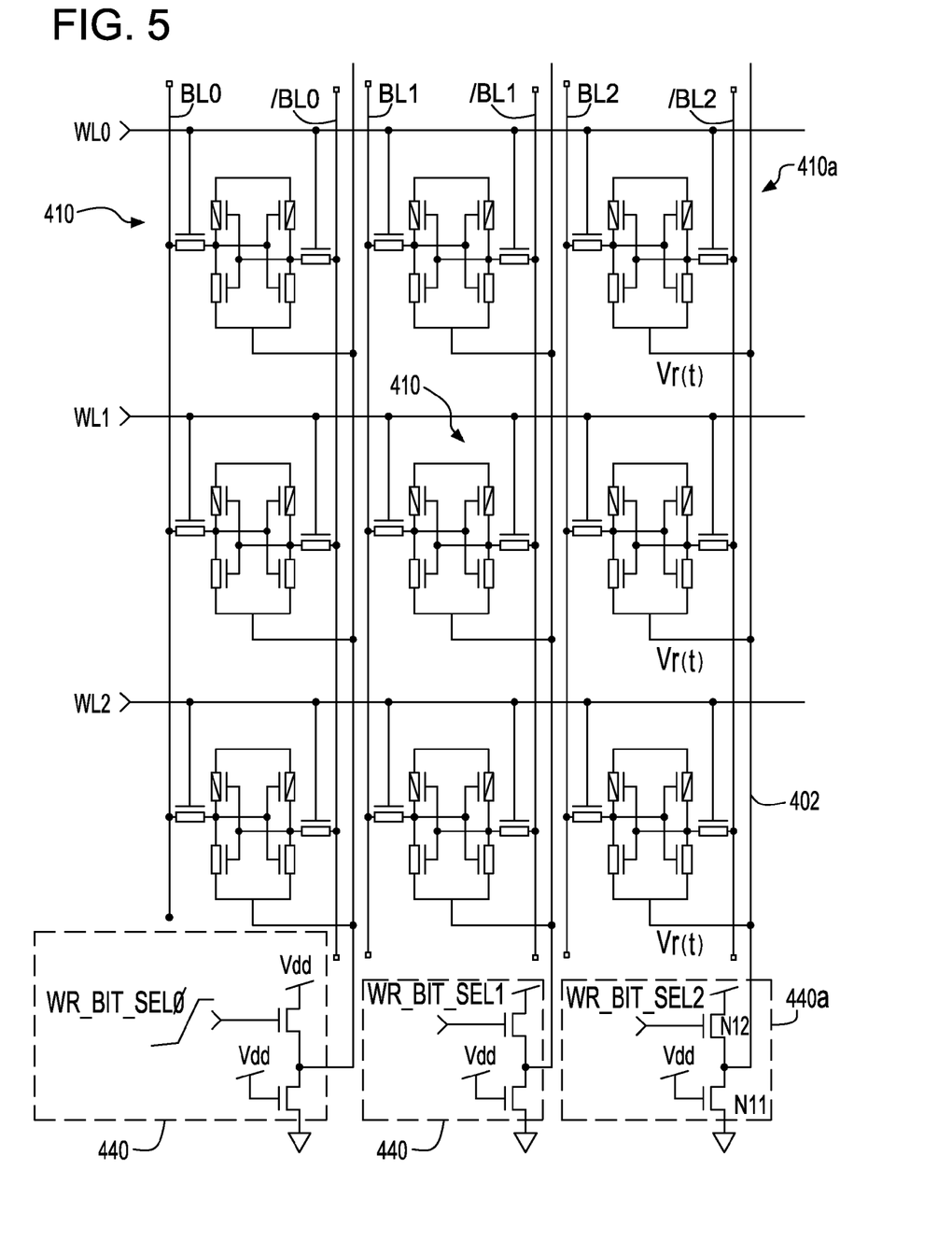
FIG. 5 is a schematic diagram illustrating an SRAM in accordance with another particular embodiment of the invention.

FIG. 5 illustrates another embodiment of the invention, in which an active write assist concept is applied to raise the voltage level of a low voltage reference Vr(t) provided through a conductor 402 to a plurality of cells 410 of a column of the SRAM. The low voltage reference takes the place of ground for cells of the SRAM. When maintaining or reading bit values stored in the SRAM, the low voltage reference Vr(t) is held at ground. When writing a selected column, the low voltage reference Vr(t) is raised above ground to make writing a cell of the selected column easier.

A plurality of voltage control circuits 440 are coupled to respective columns of an SRAM memory array, of which one voltage control circuit 440a is connected to column 402. The voltage control circuit includes a first NFET N11 and a second NFET N12. The first NFET N11 has a conduction path between the low voltage reference of the SRAM cells and ground. The gate of NFET N11 is tied to the power supply voltage Vdd. The second NFET N12 has a conduction path between the power supply voltage Vdd and the low voltage reference of the SRAM cells. A signal WR_BIT_SELn applied to the gate of transistor N12 when activated, raises the voltage level of the low voltage reference above ground.

In an example of operation, the difference between the power supply voltage level and ground is between 0.6 V and 0.8 V, nominally 0.8 V. Normally, the signal WR_BIT_SEL2 remains inactive at a low logic level, such that transistor N12 of voltage control circuit N12 remains off, and pull-down NFET device N1 is kept turned on to maintain the low voltage reference Vr(t) at ground. When column 402 is selected for writing, the WR_BIT_SEL2 is activated such that it transitions to a high logic level and turns on NFET device N12. NFET device N12 then begins to actively pull up the low voltage reference Vr(t). The active pull-up effect of device N12 causes Vr(t) to rise faster than it would for a purely passive system in which the voltage control circuit merely allows the voltage to float up.

Although device N12 actively pulls Vr(t) up, device N12's operation is self-limited because N12 turns off when the voltage level at its source (the low voltage reference Vr(t)) reaches a value of Vdd–$V_T$ ($V_T$ being the threshold voltage of N12). Moreover, N12 becomes more and more resistive as the low voltage reference Vr(t) approaches the value Vdd–VT, such that the voltage drop across N12 increases. By appropriately selecting the design of transistors N11 and N12, the rise in the low voltage reference Vr(t) can be controlled to within a fairly restricted range of voltages. In one embodiment, for example, the operation of the voltage control circuit 440a can cause a rise in Vr(t) of 150 mV. In such case, the difference between the power supply voltage level and the low voltage reference Vr(t) is reduced from 0.80 V to about 0.65 V, making cells along the selected column 402 easier to write.

In operation, writing a cell of the selected column is similar to the method described above with respect to FIGS. 3(a) through 3(d), except that the polarity of the WR_BIT_SELn signal is reversed in relation to that of WR_BIT_SECn shown in FIG. 3(a). In addition, instead of the Vs(t) waveform shown in FIG. 3(b), the low voltage reference Vr(t) rises from a resting value of ground to a raised value when the column is selected, and then falls again to ground during the restore interval.

Figure 6:
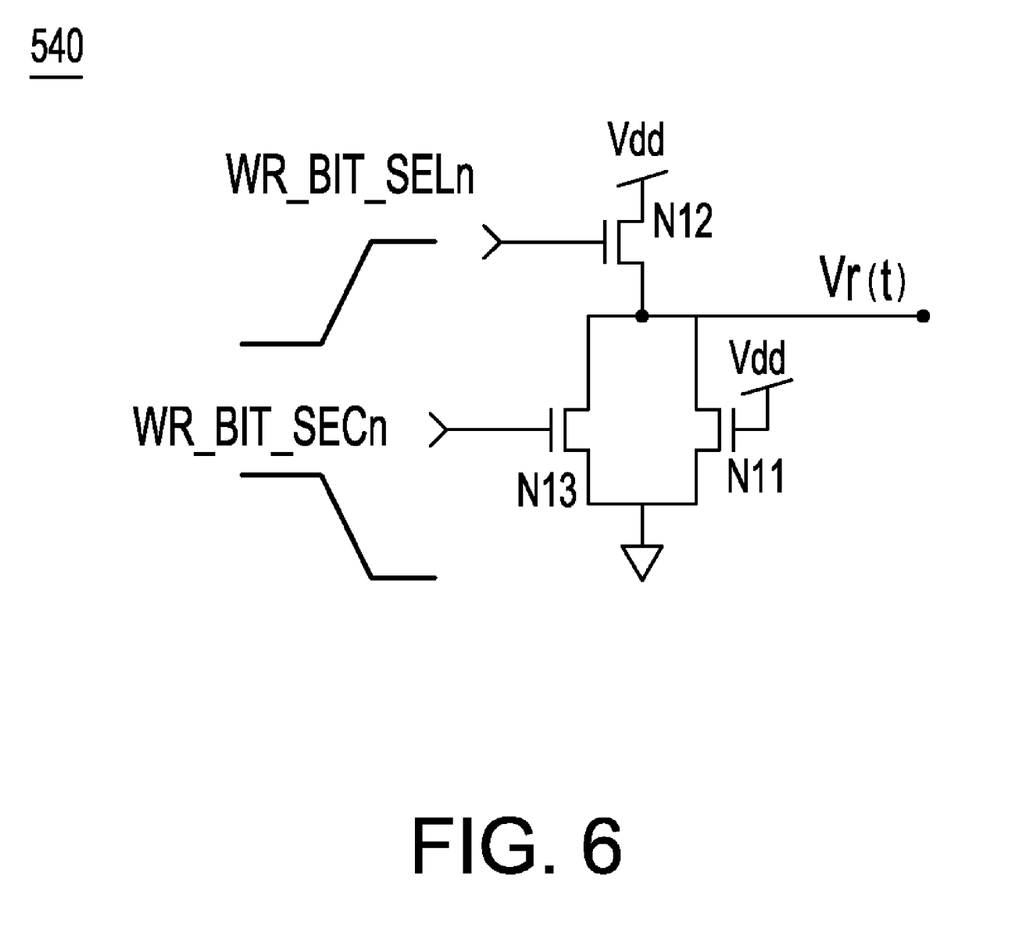
FIG. 6 is a schematic diagram illustrating an alternative voltage control circuit in accordance with a variation of the embodiment illustrated in FIG. 5.

FIG. 6 illustrates a voltage control circuit 540 according to a variation of the embodiment illustrated in FIG. 5. In this variation, an additional NFET device N13 is provided. Device N13 can be substantially larger than device N11 such that it conducts substantially greater current than device N11. For example, device N13 may conduct several times more current than N11. Device N13 is normally kept turned on as a pull-down device for maintaining the low voltage reference Vr(t) at ground when the SRAM is being read from or is holding the values of bits stored therein.

When the column is selected for writing, a signal WR_BIT_SECn applied to the gate of N13 turns N13 off. As a result, the voltage control circuit 540 then operates in a manner similar to that of voltage control circuit 440 (FIG. 5) described above.

By the foregoing embodiments, ways are provided to improve write margin (WRM) within an SRAM or other like memory without adversely affecting access disturb margin (ADM). Moreover, ways are provided to lower the power supply voltage to cells of the SRAM and then time the activation of the wordline for the greatest success in writing the SRAM within the limited cycle time of the SRAM. As one outcome of the operation of SRAMs which have voltage control circuits (FIGS. 1-4) as described herein, it is expected that when the normal (standby) power supply voltage level is less than or equal to about 0.8 V and the reduced power supply voltage level is lower than the power supply voltage level by about 0.15 V or more, fewer than one cell of the SRAM per M cells (1,048,576 cells) will fail. Similar results are expected with the voltage control circuits illustrated in FIGS. 5 and 6 when the difference between the normal power supply voltage level and the normal low voltage reference (ground) provided to SRAM cells is less than or equal to about 0.8 V and the raised low voltage reference level is higher than the normal low voltage reference level by about 0.15 V or greater.

While the invention has been described in accordance with certain preferred embodiments thereof, many modifications and enhancements can be made thereto without departing from the true scope and spirit of the invention, which is limited only by the claims appended below.

The invention claimed is:

1. A method of controlling a voltage level supplied to a static random access memory ("SRAM"), comprising:
   a) supplying power to cells of the SRAM at a power supply voltage level through a first transistor having a conduction path between a power supply input and a power supply output;
   b) selecting a column of the SRAM for writing;
   c) operating a second transistor to reduce a voltage at the power supply output to cells belonging to the selected column to a lower voltage level lower than the power supply voltage level, wherein a rate of reduction of the voltage at the power supply output slows as that voltage approaches a voltage at which the second transistor turns off;
   d) while supplying the power at the lower voltage level, writing a cell belonging to the selected column; and
   e) operating the first and second transistors to again supply the power at the power supply voltage level to the cells belonging to the first column.

2. A method as claimed in claim 1, wherein each of the first and second transistors is a PFET.

3. A method as claimed in claim 2, further comprising maintaining a voltage at a gate terminal of the first PFET at ground.

4. A method as claimed in claim 2, wherein the second PFET is operated by a selection input applied to a gate terminal of the second PFET when the column is selected.

5. A method as claimed in claim 4, wherein step (c) includes operating a third PFET having a conduction path in parallel with the first PFET.

6. A method as claimed in claim 5, wherein during step (c) the third PFET is operated to become more resistive.

7. A method as claimed in claim 6, wherein the selection input is a first selection input, and the third PFET is operated by a second selection input applied to a gate terminal of the third PFET.

8. A method as claimed in claim 7, wherein during step (c) the second PFET is operated by a rising transition in the first selection input.

9. A method as claimed in claim 2, wherein the lower voltage level is lower than the power supply voltage level by a value equal to a magnitude of a threshold voltage of the second PFET.

10. A method as claimed in claim 9, wherein the power supply voltage level is less than or equal to about 0.8 V, the lower voltage level is lower than the power supply voltage level by about 0.15 V or more, and fewer than one cell of the SRAM fails per M cells (1,048,576 cells).

11. A method of controlling a voltage level supplied as a low voltage reference to a static random access memory ("SRAM"), comprising:
   a) maintaining a low voltage reference to cells of the SRAM at ground through a first transistor having a conduction path between a low voltage reference output and ground;
   b) selecting a column of the SRAM for writing;
   c) operating a second transistor to raise a voltage of the low voltage reference to cells belonging to the selected column to a raised voltage level higher than ground, wherein a rate of increase of the voltage at the low voltage reference slows as that voltage approaches a voltage at which the second transistor turns off;
   d) while maintaining the low voltage reference at the raised voltage level, writing a cell belonging to the selected column; and
   e) operating the first and second transistors to again maintain the low voltage reference at ground.

12. A method as claimed in claim 11, wherein each of the first and second transistors is a NFET.

13. A method as claimed in claim 12, further comprising maintaining a voltage at a gate terminal of the first NFET at a power supply voltage level.

14. A method as claimed in claim 12, wherein the second NFET is operated by a selection input applied to a gate terminal of the second NFET when the column is selected.

15. A method as claimed in claim 14, wherein step (c) includes operating a third NFET having a conduction path in parallel with the first NFET.

16. A method as claimed in claim 15, wherein during step (c) the third NFET is operated to become more resistive.

17. A method as claimed in claim 16, wherein the selection input is a first selection input, and the third NFET is operated by a second selection input applied to a gate terminal of the third NFET.

18. A method as claimed in claim 17, wherein during step (c) the second NFET is operated by a rising transition in the first selection input.

19. A method as claimed in claim 12, wherein the raised voltage level is higher than ground by a value equal to a threshold voltage of the second NFET.

20. A method as claimed in claim 19, wherein the power supply voltage level is less than or equal to about 0.8 V, the raised voltage level is higher than ground by about 0.15 V or more, and fewer than one cell of the SRAM fails per M cells (1,048,576 cells).

* * * * *